US010979050B2

(12) United States Patent
Tanaka et al.

(10) Patent No.: US 10,979,050 B2
(45) Date of Patent: Apr. 13, 2021

(54) INPUT/OUTPUT CIRCUIT

(71) Applicant: Panasonic Intellectual Property Management Co., Ltd., Osaka (JP)

(72) Inventors: Haruki Tanaka, Osaka (JP); Kazuo Kita, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 17/093,839

(22) Filed: Nov. 10, 2020

(65) Prior Publication Data

US 2021/0058084 A1 Feb. 25, 2021

Related U.S. Application Data

(63) Continuation of application No. PCT/JP2019/006788, filed on Feb. 22, 2019.

(30) Foreign Application Priority Data

Jun. 5, 2018 (JP) .............................. JP2018-107794

(51) Int. Cl.
*H03K 19/018* (2006.01)
*H03K 19/0175* (2006.01)
*B25J 9/16* (2006.01)

(52) U.S. Cl.
CPC ............. *H03K 19/01806* (2013.01); *H03K 19/017536* (2013.01); *B25J 9/161* (2013.01)

(58) Field of Classification Search
CPC ............ B25J 9/161; H03K 19/017536; H03K 19/018; H03K 19/01806

(Continued)

(56) References Cited

U.S. PATENT DOCUMENTS 4,949,213 A * 8/1990 Sasagawa ............ H03K 17/615
361/91.4
5,838,526 A 11/1998 Ishikawa et al.
(Continued)

FOREIGN PATENT DOCUMENTS

JP 9-181596 7/1997
JP 9-298834 11/1997
(Continued)

OTHER PUBLICATIONS

International Search Report dated May 21, 2019 in International (PCT) Application No. PCT/JP2019/006788 with English translation.

*Primary Examiner* — William Hernandez
(74) *Attorney, Agent, or Firm* — Wenderoth, Lind & Ponack, L.L.P.

(57) ABSTRACT

For a single input/output circuit, changing an input/output form is enabled by a simple configuration. In the input/output circuit, a circuit section includes power supply terminals and ground terminals. A switching section is switchable between a first state in which a power supply line and a ground line are coupled to one of the power supply terminals and one of the ground terminals and a second state in which the power supply line and the ground line are coupled to the other one of the power supply terminals and the other one of the ground terminals. The circuit section operates as a circuit corresponding to one of an open collector output and an open emitter output in the first state and operates as a circuit corresponding to the other one of the open collector output and the open emitter output in the second state.

4 Claims, 3 Drawing Sheets

(58) Field of Classification Search
USPC .......................................... 327/419, 478, 574
See application file for complete search history.

(56) References Cited

U.S. PATENT DOCUMENTS

| | | |
|---|---|---|
| 5,880,606 A | 3/1999 | Griesbach |
| 2003/0051231 A1 | 3/2003 | Schwemmlein et al. |
| 2004/0054439 A1 | 3/2004 | Morita et al. |
| 2011/0121210 A1* | 5/2011 | Oono .................. G05B 19/054 250/551 |

FOREIGN PATENT DOCUMENTS

| | | |
|---|---|---|
| JP | 11-31017 | 2/1999 |
| JP | 2003-108208 | 4/2003 |
| JP | 2005-502126 | 1/2005 |
| JP | 2010-069787 | 4/2010 |

* cited by examiner

INPUT/OUTPUT CIRCUIT

CROSS-REFERENCE TO RELATED APPLICATIONS

This is a continuation of International Application No. PCT/JP2019/006788 filed on Feb. 22, 2019, which claims priority to Japanese Patent Application No. 2018-107794 filed on Jun. 5, 2018. The entire disclosures of these applications are incorporated by reference herein.

BACKGROUND

In a case in which different devices are coupled to each other and used, a signal is transferred therebetween using a general-purpose input/output circuit in some cases. However, when an input/output form differs depending on devices that are used, a signal cannot be transferred. As output circuit types, there are, for example, open collector output circuits and open emitter output circuits. For an open collector output circuit, an input circuit corresponding thereto is needed and, for an open emitter output circuit, an input circuit corresponding thereto is needed.

In Japanese Unexamined Patent Publication No. 2003-108208, a configuration in which a common circuit of an input/output circuit and an individual corresponding section that differs depending on a circuit form are separated and a plurality of individual corresponding sections are provided to thus enable changing the circuit form is proposed.

Incidentally, in the configuration of Japanese Unexamined Patent Publication No. 2003-108208, in order to enable changing the circuit form, it is needed to provide a plurality of input/output circuits, resulting in a redundant circuit configuration.

In view of the foregoing, the present disclosure has been devised and it is therefore an object of the present disclosure to enable changing an input/output form for a single input/output circuit by a simple configuration.

SUMMARY

In order to achieve the above described object, according to the present disclosure, for a single input/output circuit, changing an input/output form is enabled by selection of a power supply path.

Specifically, an input/output circuit for performing input and output of a signal includes a circuit section including a first power supply terminal, a second power supply terminal, a first ground terminal, and a second ground terminal, and a switching section coupled to a power supply line and a ground line and configured to switch between a first state in which the power supply line and the ground line are electrically coupled to the first power supply terminal and the first ground terminal of the circuit section, respectively, and a second state in which the power supply line and the ground line are electrically coupled to the second power supply terminal and the second ground terminal of the circuit section, respectively, and the circuit section is configured to operate as a circuit corresponding one of an open collector output and an open emitter output when the switching section is in the first state and to operate as a circuit corresponding to the other one of the open collector output and the open emitter output when the switching section is in the second state.

According to this configuration, in the input/output circuit, the circuit section includes the first and second power supply terminals and the first and second ground terminals. The switching section switches between the first state in which the power supply line and the ground line are electrically coupled to the first power supply terminal and the first ground terminal, respectively, and the second state in which the power supply line and the ground line are electrically coupled to the second power supply terminal and the second ground terminal, respectively. The circuit section operates as a circuit corresponding one of an open collector output and an open emitter output when the switching section is in the first state, that is, when a power supply voltage is applied to the first power supply terminal and the first ground terminal and operates as a circuit corresponding to the other one of the open collector output and the open emitter output when the switching section is in the second state, that is, when the power supply voltage is applied to the second power supply terminal and the second ground terminal. Therefore, a single input/output circuit can be caused to operate as a circuit corresponding to an open collector output or a circuit corresponding to an open emitter output by selection of a power supply path performed by the switching section.

The circuit section may include an output circuit, the output circuit may include a photocoupler an input of which a signal is given to, a bipolar transistor a base of which is coupled to an output side of the photocoupler, and an output terminal outputting a signal, one of a collector and an emitter of the bipolar transistor may be coupled to the second power supply terminal and may be coupled to the output terminal via a diode configured such that a direction toward the output terminal is a reverse direction, and the other one of the collector and the emitter of the bipolar transistor may be coupled to the first ground terminal and may be coupled to the output terminal via a diode configured such that a direction toward the output terminal is a forward direction.

According to this configuration, the output circuit including the photocoupler and the bipolar transistor can be caused to operate as an open collector output circuit or an open emitter output circuit by selection of a power supply path performed by the switching section.

The bipolar transistor may be an NPN transistor, and a phototransistor of the photocoupler may be configured such that an emitter thereof is coupled to a base of the NPN transistor and a collector thereof is coupled to the first power supply terminal and the second power supply terminal.

Thus, the output circuit can be realized using the NPN transistor.

The bipolar transistor may be a PNP transistor, and a phototransistor of the photocoupler may be configured such that a collector thereof is coupled to a base of the PNP transistor and an emitter thereof is coupled to the first ground terminal and the second ground terminal.

Thus, the output circuit can be realized using the PNP transistor.

According to the present disclosure, both a circuit corresponding to an open collector output and a circuit corresponding to an open emitter output can be realized by a single input/output circuit.

DETAILED DESCRIPTION

An embodiment of the present disclosure will be described in detail below with reference to the accompanying drawings. The description of the following preferred embodiment describes a mere example by nature and is not intended to limit the scope, application, or use of the present disclosure.

Figure 1:
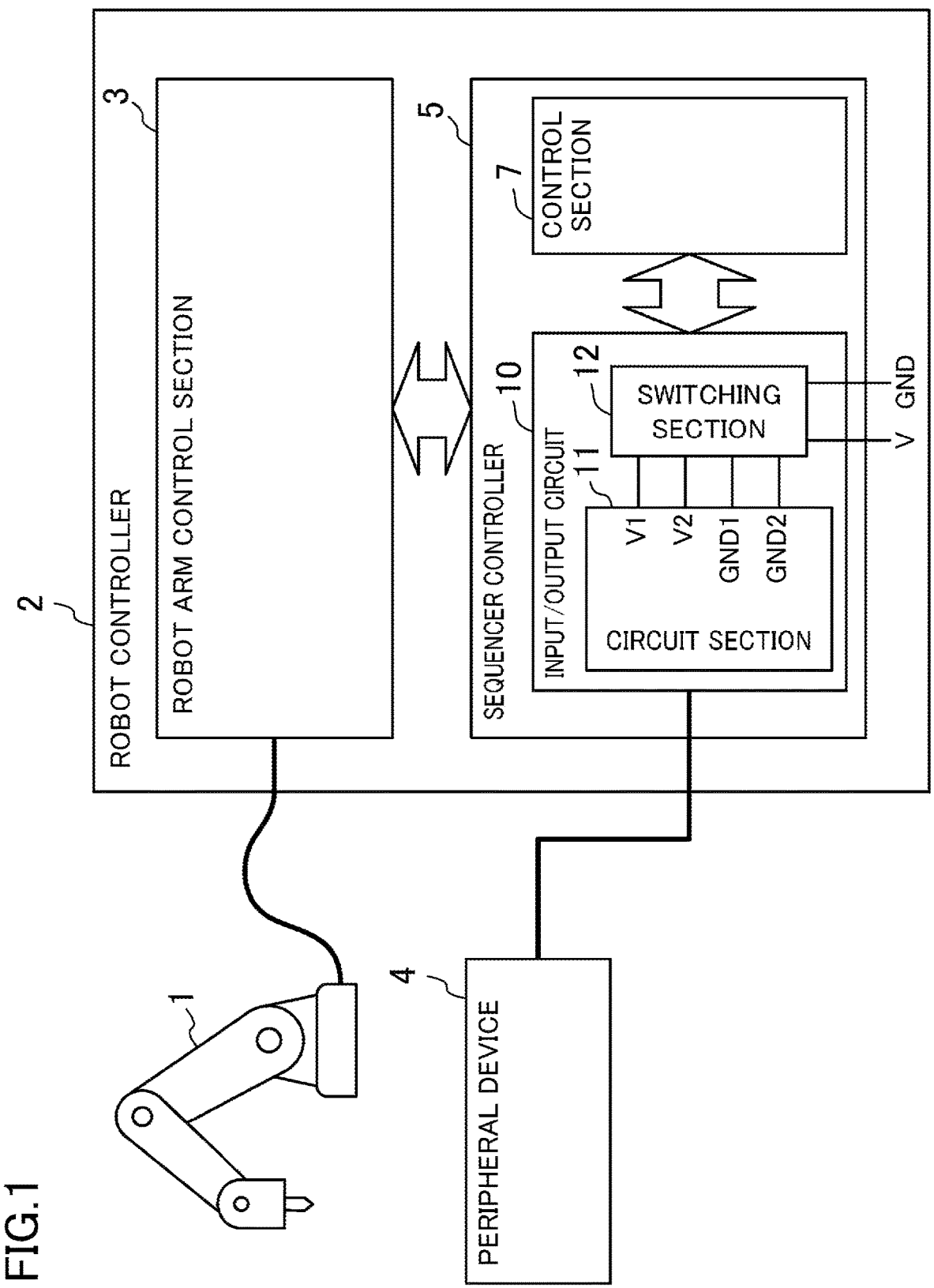
FIG. 1 is a diagram illustrating a configuration example of a robot controller including an input/output circuit according to an embodiment.

FIG. 1 is a diagram illustrating a configuration example including a robot controller including an input/output circuit according to an embodiment and a periphery thereof. In FIG. 1, a robot body 1 is driven by a robot arm control section 3 of a robot controller 2. A peripheral device 4 that performs an operation in corporation with the robot body 1 is controlled by a sequencer controller 5 of the robot controller 2.

The sequencer controller 5 includes an input/output circuit 10 and a control section 7. The input/output circuit 10 receives a signal indicating an operation state of the peripheral device 4 and outputs a control signal to the peripheral device 4 in accordance with an operation state of the robot body 1. The control section 7 processes a signal from the peripheral device 4 and a signal from the robot arm control section 3 and performs control.

In this embodiment, the input/output circuit 10 includes a circuit section 11 and a switching section 12. The circuit section 11 includes power supply terminals V1 and V2 and ground terminals GND1 and GND2. The switching section 12 is coupled to a power supply line V and a ground line GND and is configured to select a power supply path to the circuit section 11.

Figure 2:
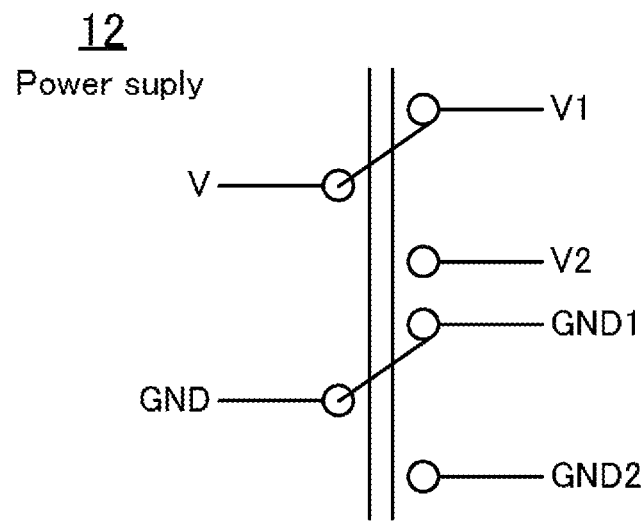
FIG. 2 is a diagram illustrating a configuration example of a switching section in the embodiment.

FIG. 2 is a diagram illustrating a configuration example of the switching section 12. That is, the switching section 12 is configured to switch between a first state in which the power supply line V and the ground line GND are electrically coupled to the power supply terminal V1 and the ground terminal GND1 of the circuit section 11, respectively, and a second state in which the power supply line V and the ground line GND are electrically coupled to the power supply terminal V2 and the ground terminal GND2 of the circuit section 11, respectively. Specifically, the switching section 12 is formed, for example, by a relay, a toggle switch, or the like.

The circuit section 11 is configured to operate as a circuit corresponding to an open collector output when the switching section 12 sets the first state and to operate as a circuit corresponding to an open emitter output when the switching section 12 sets the second state.

Figure 3:
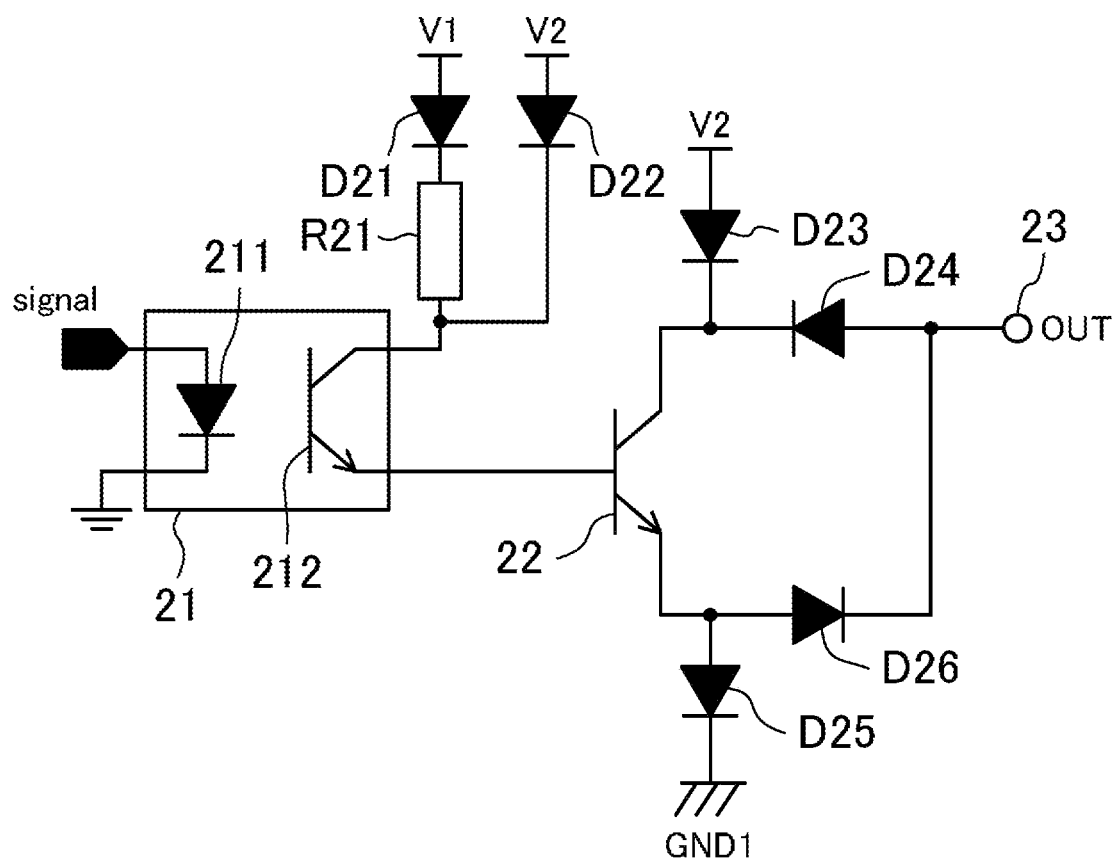
FIG. 3 is a circuit diagram illustrating a circuit configuration example of an output circuit in the embodiment.

A specific circuit configuration will be described below. FIG. 3 is a circuit diagram illustrating a circuit configuration example of an output circuit of the circuit section 11, and FIG. 4 is a circuit diagram illustrating a circuit configuration example of an input circuit of the circuit section 11.

The output circuit of FIG. 3 includes a photocoupler 21 configured to receive a signal, an NPN-type bipolar transistor 22, and an output terminal 23 outputting a signal. The reference symbols D21 to D26 denote diodes and the reference symbol R21 denotes a resistance element. The photocoupler 21 includes a photodiode 211 and a phototransistor 212 and a signal is given to an input side, that is, a photodiode 211 side. The bipolar transistor 22 is configured such that a base thereof is coupled to an output side of the photocoupler 21, that is, a phototransistor 212 side. In this case, the base of the bipolar transistor 22 is coupled to an emitter of the phototransistor 212. A collector of the phototransistor 212 is coupled to the power supply terminal V1 via the diode D21 and the resistance element R21 and is coupled to the power supply terminal V2 via the diode D22.

A collector of the bipolar transistor 22 is coupled to the power supply terminal V2 via the diode D23 and is coupled to the output terminal 23 via the diode D24. The diode D24 is configured such that a direction toward the output terminal 23 is a reverse direction. An emitter of the bipolar transistor 22 is coupled to the ground terminal GND1 via the diode D25 and is coupled to the output terminal 23 via the diode D26. The diode D26 is configured such that a direction toward the output terminal 23 is a forward direction.

Figure 4:
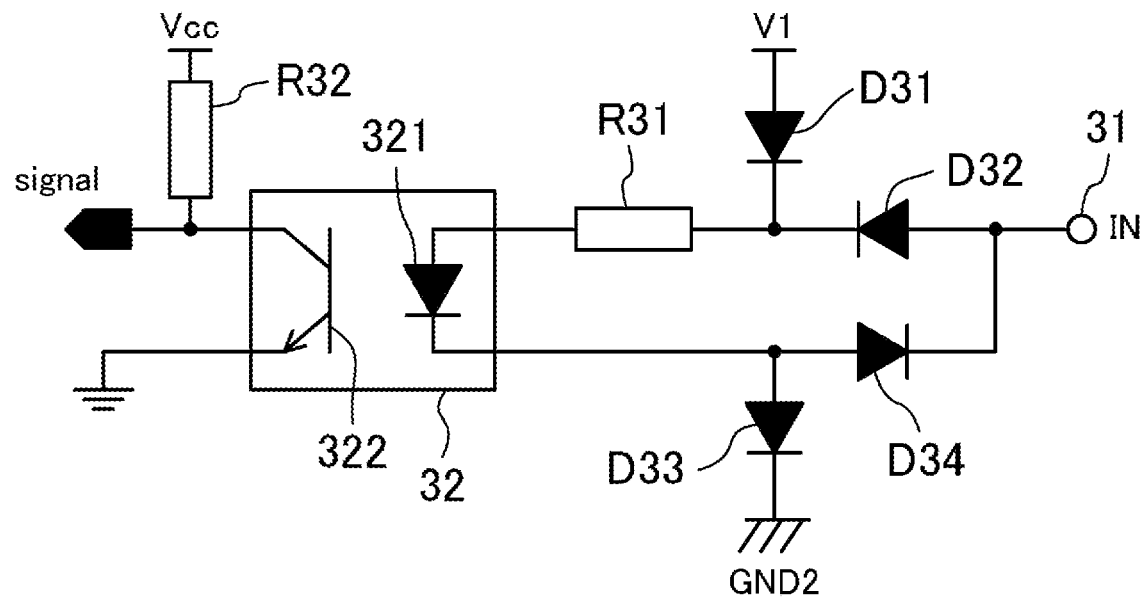
FIG. 4 is a circuit diagram illustrating a circuit configuration example of an input circuit in the embodiment.

The input circuit of FIG. 4 includes an input terminal 31 to which a signal is input and a photocoupler 32 configured to output a signal. The reference symbols D31 to D34 denote diodes and the reference symbols R31 to R32 denote resistance elements. The photocoupler 32 includes a photodiode 321 and a phototransistor 322 and is configured such that a signal is output from an output side, that is, a photo transistor 322 side. An anode of the photodiode 321 is coupled to the power supply terminal V1 via the resistance element R31 and the diode D31 and is coupled to the input terminal 31 via the resistance element R31 and the diode D32. The diode D32 is configured such that a direction toward the input terminal 31 is a reverse direction. A cathode of the photodiode 321 is coupled to the ground terminal GND2 via the diode D33 and is coupled to the input terminal 31 via the diode D34. The diode D34 is configured such that a direction toward the input terminal 31 is a forward direction.

In this case, it is assumed that the switching section 12 sets the first state in which the power supply line V and the ground line GND are coupled to the power supply terminal V1 and the ground terminal GND1 of the circuit section 11, respectively. In the first state, a power supply voltage is applied between the power supply terminal V1 and the ground terminal GND1, and the power supply terminal V2 and the ground terminal GND2 are put in an open state. In this case, in the output circuit of FIG. 3, the power supply line V is coupled to the collector of the phototransistor 212 in the photocoupler 21, and the bipolar transistor 22 is put in a state in which the collector thereof is coupled to the output terminal 23 and the emitter thereof is coupled to the ground line GND. That is, the output circuit of FIG. 2 serves as an open collector output circuit. In the input circuit of FIG. 4, the power supply line V is coupled to the anode of the photodiode 321 in the photocoupler 32 and the input terminal 31 is coupled to the cathode thereof. That is, the input circuit of FIG. 4 serves as an input circuit corresponding to an open collector output.

It is also assumed that the switching section 12 sets the second state in which the power supply line V and the ground line GND are coupled to the power supply terminal V2 and the ground terminal GND2 of the circuit section 11, respectively. In the second state, the power supply voltage is applied between the power supply terminal V2 and the ground terminal GND2, and the power supply terminal V1 and the ground terminal GND1 are put in an open state. In this case, in the output circuit of FIG. 3, the power supply line V is coupled to the collector of the phototransistor 212 in the photocoupler 21 and the bipolar transistor 22 is put in a state in which the collector thereof is coupled to the power supply line V and the emitter thereof is coupled to the output terminal 23. That is, the output circuit of FIG. 3 serves as an open emitter output circuit. In the input circuit of FIG. 4, the input terminal 31 is coupled to the anode of the photodiode 321 in the photocoupler 32 and the ground line GND is coupled to the cathode thereof. That is, the input circuit of FIG. 4 serves as an input circuit corresponding to an open emitter output.

As described above, according to this embodiment, in the input/output circuit 10, the circuit section 11 operates as a circuit corresponding to an open collector output when the switching section 12 is in the first state, that is, when the power supply voltage is applied to the power supply terminal V1 and the ground terminal GND1. On the other hand, the circuit section 11 operates as a circuit corresponding to an open emitter output when the switching section 12 is in the second state, that is, when the power supply voltage is applied to the power supply terminal V2 and the ground terminal GND2. Therefore, a single input/output circuit 10 can be caused to operate as the circuit corresponding to an open collector output or the circuit corresponding to an open emitter output by selection of the power supply path performed by the switching section 12.

Note that the input/output circuit 10 may include only one of the output circuit or the input circuit. Also, the input/output circuit 10 may include a plurality of output circuits or input circuits, or may include a plurality of output circuits and a plurality of input circuits. In this case, the input/output circuit 10 may be configured such that input/output forms of all of circuits are switched by a single switching section. As another alternative, the input/output circuit 10 may be configured such that a switching section is provided for each circuit and an input/output form of each circuit is separately switched.

The circuits of FIG. 3 and FIG. 4 are merely examples of the output circuit and the input circuit included in an input/output circuit, and the present disclosure is not limited to these circuit examples. For example, in the output circuit, instead of the NPN type bipolar transistor 22, a PNP type bipolar transistor may be used, and a field effect transistor (FET) may be used.

Figure 5:
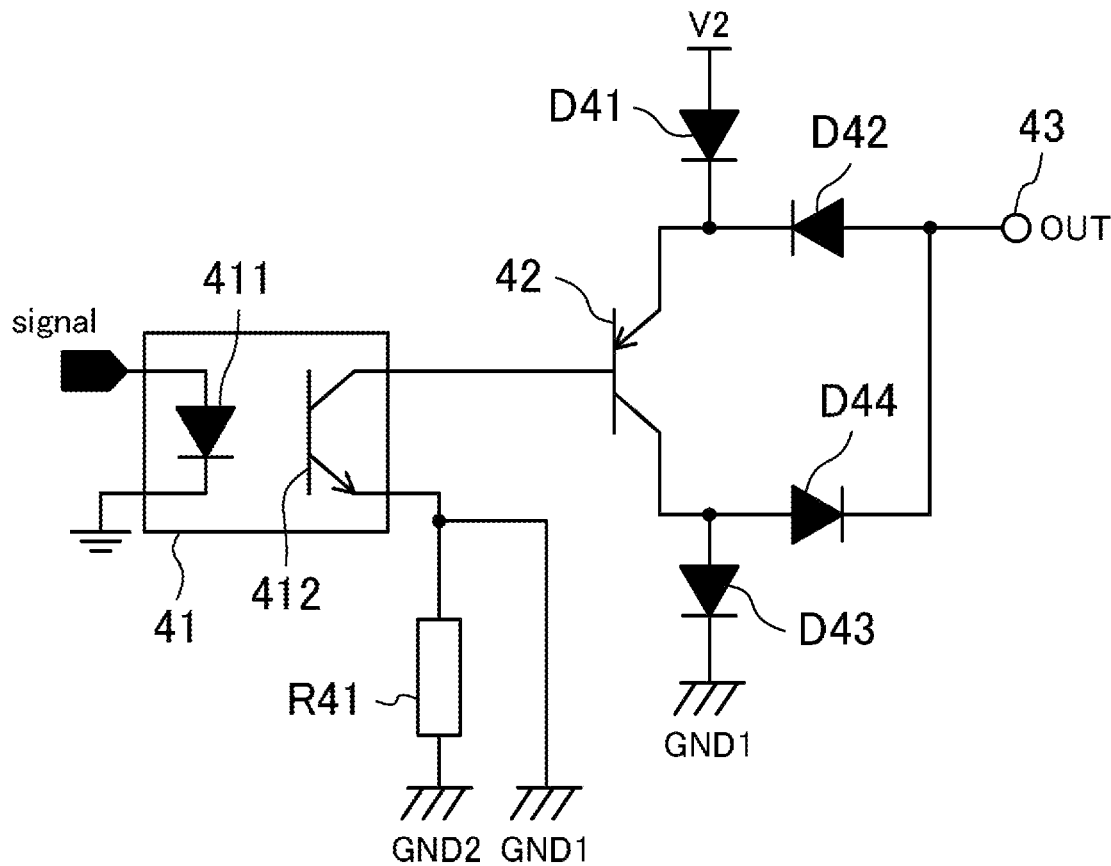
FIG. 5 is a circuit diagram illustrating another circuit configuration example of the output circuit in the embodiment.

FIG. 5 is a circuit diagram illustrating a circuit configuration example of the output circuit and this circuit configuration example employs a PNP type bipolar transistor. The output circuit of FIG. 5 includes a photocoupler 41 configured to receive a signal, a PNP bipolar transistor 42, and an output terminal 43 outputting a signal. The reference symbols D41 to D44 denote diodes and the reference symbol R41 denotes a resistance element. The photocoupler 41 includes a photodiode 411 and a phototransistor 412, and a signal is given to an input side, that is, a photodiode 411 side. The bipolar transistor 42 is configured such that a base thereof is coupled to an output side of the photocoupler 41, that is, a phototransistor 412 side. In this case, the base of the bipolar transistor 42 is coupled to a collector of the phototransistor 412. An emitter of the phototransistor 412 is coupled to the ground terminal GND1 and is coupled to the ground terminal GND2 via the resistance element R41.

An emitter of the bipolar transistor 42 is coupled to the power supply terminal V2 via the diode D41 and is coupled to the output terminal 43 via the diode D42. The diode D42 is configured such that a direction toward the output terminal 43 is a reverse direction. The collector of the bipolar transistor 42 is coupled to the ground terminal GND1 via the diode D43 and is coupled to the output terminal 43 via the diode D44. The diode D44 is configured such that a direction toward the output terminal 43 is a forward direction.

In this case, in a case in which the switching section 12 sets the first state, in the output circuit of FIG. 5, the ground line GND is coupled to the emitter of the phototransistor 412 in the photocoupler 41 and the bipolar transistor 42 is put in a state in which the emitter thereof is coupled to the output terminal 43 and the collector thereof is coupled to the ground line GND. That is, the output circuit of FIG. 5 serves as an open emitter output circuit. On the other hand, in a case in which the switching section 12 sets the second state, in the output circuit of FIG. 5, the ground line GND is coupled to the emitter of the phototransistor 412 in the photocoupler 41 and the bipolar transistor 42 is put in a state in which the emitter thereof is coupled to the power supply line V and the collector thereof is coupled to the output terminal 43. That is, the output circuit of FIG. 5 serves as an open collector output circuit.

Note that, in the above described embodiment, description has been made using a configuration in which the robot controller 2 includes the input/output circuit 10 as an example. However, an input/output circuit according to the present disclosure is applicable to some other configuration in which a signal is transferred between different devices.

In the present disclosure, in a single input/output circuit, changing an input/output form is enabled by selection of a power supply path, and therefore, the present disclosure is useful, for example, for simplifying a configuration of an input/output circuit.

What is claimed is:

1. An input/output circuit for performing input and output of a signal, the input/output circuit comprising:
   a circuit section including a first power supply terminal, a second power supply terminal, a first ground terminal, and a second ground terminal; and
   a switching section coupled to a power supply line and a ground line and configured to switch between a first state in which the power supply line and the ground line are electrically coupled to the first power supply terminal and the first ground terminal of the circuit section, respectively, and a second state in which the power supply line and the ground line are electrically coupled to the second power supply terminal and the second ground terminal of the circuit section, respectively,
   wherein
      the circuit section is configured to operate as a circuit corresponding one of an open collector output and an open emitter output when the switching section is in the first state and to operate as a circuit corresponding to the other one of the open collector output and the open emitter output when the switching section is in the second state.

2. The input/output circuit of claim 1, wherein
   the circuit section includes an output circuit,
   the output circuit includes
      a photocoupler, an input side of which a signal is given to,
      a bipolar transistor, a base of which is coupled to an output side of the photocoupler, and
      an output terminal outputting a signal,
      one of a collector and an emitter of the bipolar transistor is coupled to the second power supply terminal and is coupled to the output terminal via a diode configured such that a direction toward the output terminal is a reverse direction, and
      the other one of the collector and the emitter of the bipolar transistor is coupled to the first ground terminal and is coupled to the output terminal via a diode configured such that a direction toward the output terminal is a forward direction.

3. The input/output circuit of claim 2, wherein
the bipolar transistor is an NPN transistor,
a phototransistor of the photocoupler is configured such that an emitter thereof is coupled to a base of the NPN transistor and a collector thereof is coupled to the first power supply terminal and the second power supply terminal.

4. The input/output circuit of claim 2, wherein
the bipolar transistor is a PNP transistor, and
a phototransistor of the photocoupler is configured such that a collector thereof is coupled to a base of the PNP transistor and an emitter thereof is coupled to the first power supply terminal and the second power supply terminal.

\* \* \* \* \*